United States Patent
Her et al.

(10) Patent No.: US 10,770,166 B2
(45) Date of Patent: Sep. 8, 2020

(54) MEMORY DEVICE AND OPERATING METHOD TO DETERMINE A DEFECTIVE MEMORY BLOCK

(71) Applicant: SK hynix Inc., Icheon-si, Gyeonggi-do (KR)

(72) Inventors: Min Ho Her, Cheongju-si (KR); Dong Hyun Kim, Icheon-si (KR); Jeong Hoon Park, Cheongju-si (KR); Youn Ho Jung, Cheongju-si (KR); Seung Ju Ha, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/195,615

(22) Filed: Nov. 19, 2018

(65) Prior Publication Data

US 2019/0304563 A1      Oct. 3, 2019

(30) Foreign Application Priority Data

Mar. 30, 2018    (KR) .................. 10-2018-0037361

(51) Int. Cl.
| | |
|---|---|
| *G11C 16/14* | (2006.01) |
| *G11C 16/04* | (2006.01) |
| *G11C 29/50* | (2006.01) |

(52) U.S. Cl.
CPC .... *G11C 29/50004* (2013.01); *G11C 16/0483* (2013.01); *G11C 16/14* (2013.01); *G11C 2029/5004* (2013.01); *G11C 2216/18* (2013.01)

(58) Field of Classification Search
CPC .............. G11C 29/50004; G11C 16/14; G11C 16/0483; G11C 2216/18; G11C 2029/5004
See application file for complete search history.

(56) References Cited

U.S. PATENT DOCUMENTS

| | | | | |
|---|---|---|---|---|
| 5,754,558 A | * | 5/1998 | Hayakawa ............. | G11C 29/50 365/201 |
| 8,891,314 B2 | * | 11/2014 | Park ....................... | G11C 16/10 365/185.17 |
| 2011/0176362 A1 | * | 7/2011 | Shibata ............... | G11C 11/5635 365/185.03 |
| 2012/0269001 A1 | * | 10/2012 | Ueno ..................... | G11C 16/16 365/185.22 |
| 2013/0159814 A1 | * | 6/2013 | Hashimoto ............ | G11C 29/04 714/773 |
| 2017/0371755 A1 | * | 12/2017 | Yang .................... | G06F 11/2094 |
| 2018/0143762 A1 | * | 5/2018 | Kim .................... | G11C 16/3431 |

FOREIGN PATENT DOCUMENTS

| | | |
|---|---|---|
| KR | 1020060120889 A | 11/2006 |
| KR | 1020160086474 A | 7/2016 |

* cited by examiner

*Primary Examiner* — Sultana Begum
(74) *Attorney, Agent, or Firm* — William Park & Associates Ltd.

(57) ABSTRACT

Provided herein is a memory device and a method of operating the memory device. The memory device may include a one or more memory blocks, one or more peripheral circuits configured to perform an erase operation and a threshold voltage distribution scan operation on a selected memory block, and a control logic configured to control the one or more peripheral circuits, and determine the selected memory block to be a normal memory block or a defective memory block based on a result of the threshold voltage distribution scan operation.

17 Claims, 9 Drawing Sheets

MEMORY DEVICE AND OPERATING METHOD TO DETERMINE A DEFECTIVE MEMORY BLOCK

CROSS-REFERENCE TO RELATED APPLICATION

The present application claims priority under 35 U.S.C. § 119(a) to Korean patent application number 10-2018-0037361 filed on Mar. 30, 2018, in the Korean Intellectual Property Office, the entire disclosure of which is incorporated herein by reference.

BACKGROUND

1. Technical Field

Various embodiments of the present disclosure generally relate to a memory device and a method of operating the memory device, and more particularly, to a memory device, which may efficiently manage a defective memory block, and a method of operating the memory device.

2. Related Art

Recently, the paradigm for a computer environment has been converted into ubiquitous computing so that computer systems can be used anytime and anywhere. Due to this, the use of portable electronic devices such as mobile phones, digital cameras, and notebook computers has rapidly increased. In general, such portable electronic devices use a memory system which employs a memory device, in other words, use a data storage device. The data storage device is used as a main memory device or an auxiliary memory device for portable electronic devices.

A data storage device using a memory device provides advantages in that, since there is no mechanical driving part, stability and durability are excellent, an information access speed is very high, and power consumption is low. Data storage devices, as an example of the memory system having such advantages, include a universal serial bus (USB) memory device, memory cards having various interfaces, a solid state drive (SSD), etc.

SUMMARY

An embodiment of the present disclosure may provide for a memory device. The memory device may include one or more memory blocks, one or more peripheral circuits configured to perform an erase operation and a threshold voltage distribution scan operation on a selected memory block, and a control logic configured to control the one or more peripheral circuits, and determine the selected memory block to be a normal memory block or a defective memory block based on a result of the threshold voltage distribution scan operation.

An embodiment of the present disclosure may provide for a memory device. The memory device may include one or more memory blocks, one or more peripheral circuits configured to perform an erase operation on a selected memory block and a threshold voltage distribution scan operation on one or more select transistors included in the selected memory block, and a control logic configured to control the one or more peripheral circuits and determine the selected memory block to be a normal memory block or a defective memory block based on a result of the threshold voltage distribution scan operation.

An embodiment of the present disclosure may provide for a method of operating a memory device. The method may include performing an erase operation on a selected memory block, monitoring threshold voltage distributions of one or more select transistors included in the selected memory block, and determining the selected memory block to be a defective memory block or a normal memory block based on a result of the monitoring.

DETAILED DESCRIPTION

Figure 1:
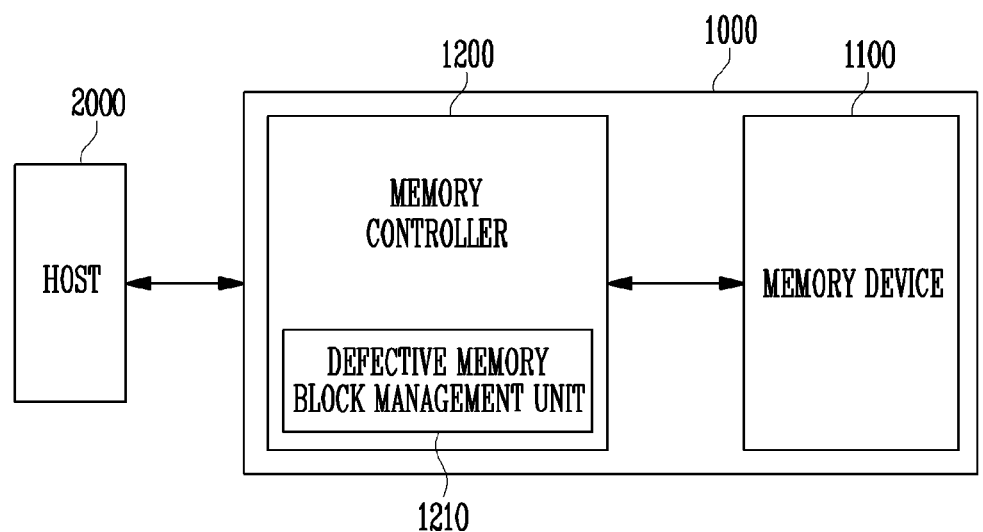
FIG. 1 is a diagram illustrating a memory system according to an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure may be embodied in many different forms and should not be construed as being limited to only the embodiments set forth herein, but should be construed as covering modifications, equivalents or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the gist of the present disclosure clear.

Embodiments of the present disclosure are described with reference to the accompanying drawings in order to describe the present disclosure in detail so that those having ordinary knowledge in the technical field to which the present disclosure pertains can easily practice the present disclosure.

Various embodiments of the present disclosure may be directed to a memory device and a method of operating the memory device, which can determine a defective memory block by monitoring threshold voltage distributions of select transistors included in the memory device.

FIG. 1 is a diagram illustrating a memory system according to an embodiment of the present disclosure.

Referring to FIG. 1, a memory system 1000 may include a memory device 1100 which stores data, and a memory controller 1200 which controls the memory device 1100 under the control of a host 2000.

The host 2000 is capable of communicating with the memory system 1000 using an interface protocol, such as Peripheral Component Interconnect-Express (PCI-E), Advanced Technology Attachment (ATA), Serial ATA (SATA), Parallel ATA (PATA) or Serial Attached SCSI (SAS). In addition, the interface protocol between the host 2000 and the memory system 1000 is not limited to the above-described examples, and may be one of various interface protocols such as Universal Serial Bus (USB), Multi-Media Card (MMC), Enhanced Small Disk Interface (ESDI), and Integrated Drive Electronics (IDE) interface protocols.

The memory controller 1200 may control the overall operation of the memory system 1000, and may control data exchange between the host 2000 and the memory device 1100. For example, the memory controller 1200 may program or read data or erase programmed data by controlling the memory device 1100 in response to a program command, a read command, or an erase command received from the host 2000. For example, when the program command, the read command or the erase command is received from the host 2000, the memory controller 1200 may generate an internal command corresponding to each command, and may output the internal command to the memory device 1100. The memory device 1100 may perform the program, read or erase operation in response to the internal command. Further, when the erase command is received from the host 2000, the memory controller 1200 may control the memory device 1100 so that, after memory cells included in a selected memory block of the memory device 1100 are erased in response to the erase command, threshold voltage distributions of select transistors included in the selected memory block are monitored. The memory controller 1200 may include a defective memory block management unit 1210 which determines and manages each memory block to be a normal memory block or a defective memory block based on the result of monitoring the threshold voltage distributions of the select transistors. For example, when a block, in which the threshold voltage distributions of the select transistors fall out of a normal range, may be determined to be a defective memory block. The memory block determined to be the defective memory block may be processed as a bad block. In some embodiments, the select transistors may include one or more of drain select transistors and/or source select transistors. In other embodiments, the select transistors may include drain select transistors, source select transistors, and/or pipe transistors.

The memory device 1100 may perform a program operation, a read operation or an erase operation under the control of the memory controller 1200. In an embodiment, the memory device 1100 may include a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus DRAM (RDRAM) or a flash memory, etc.

In the embodiment of the present disclosure, although the defective memory block management unit 1210 is illustrated and described as being included in the memory controller 1200, it may be configured to be included in the memory device 1100.

Figure 2:
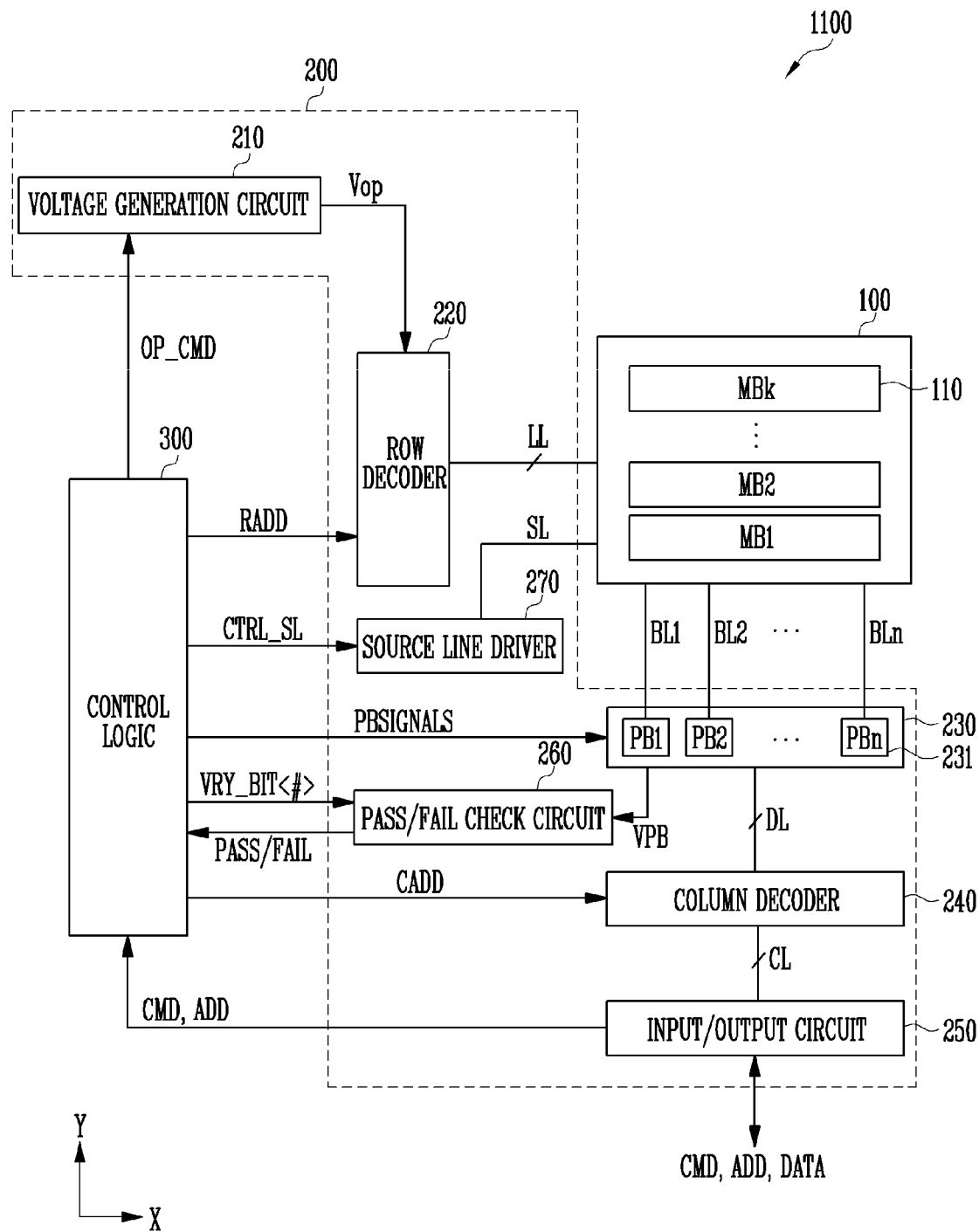
FIG. 2 is a diagram illustrating a memory device of FIG. 1.

FIG. 2 is a diagram illustrating the memory device of FIG. 1.

Referring to FIG. 2, the memory device 1100 may include a memory cell array 100 in which data is stored. The memory device 1100 may also include peripheral circuits 200, which perform a program operation for storing data in the memory cell array 100, a read operation for outputting stored data, and an erase operation for erasing stored data. The memory device 1100 may include a control logic 300, which controls the peripheral circuits 200 under the control of a memory controller (e.g., 1200 of FIG. 1). In an embodiment, the control logic 300 may be implemented with software, hardware, or any combination thereof, The memory cell array 100 may include a plurality of memory blocks MB1 to MBk 110 (where k is a positive integer). Local lines LL and bit lines BL1 to BLn (where n is a positive integer) may be coupled to each of the memory blocks MB1 to MBk 110. For example, the local lines LL may include a first select line, a second select line, and a plurality of word lines arranged between the first and second select lines. Further, the local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines. For example, the local lines LL may further include dummy lines. For example, the local lines LL may further include pipelines. The local lines LL may be coupled to the memory blocks MB1 to MBk 110, respectively, and the bit lines BL1 to BLn may be coupled in common to the memory blocks MB1 to MBk 110. The memory blocks MB1 to MBk 110 may be implemented as a two-dimensional (2D) or a three-dimensional (3D) structure. For example, the memory cells in the memory blocks 110 having a 2D structure may be arranged horizontally on a substrate. For example, memory cells in the memory blocks 110 having a 3D structure may be stacked vertically on the substrate.

The peripheral circuits 200 may perform program, read, and erase operations on a selected memory block 110 under the control of the control logic 300. Further, after performing an erase operation on the selected memory block 110 under the control of the control logic 300, the peripheral circuits 200 may monitor the threshold voltage distributions of select transistors and a pipe transistor included in the selected memory block 110, and may output the result of the monitoring to the memory controller (e.g., 1200 of FIG. 1).

For example, the peripheral circuits 200 may include a voltage generation circuit 210, a row decoder 220, a page buffer group 230, a column decoder 240, an input/output circuit 250, a pass/fail check circuit 260, and a source line driver 270.

The voltage generation circuit 210 may generate various operating voltages Vop that are used for program, read, and erase operations and for operations of monitoring the threshold voltage distributions of the select transistors and the pipe transistor in response to an operation signal OP_CMD. For example, the voltage generation circuit 210 may generate a program voltage, a verify voltage, pass voltages, a read voltage, a source line voltage, etc. under the control of the control logic 300.

The row decoder 220 may transfer the operating voltages Vop to the local lines LL coupled to the selected memory block 110 in response to a row address RADD.

The page buffer group 230 may include a plurality of page buffers PB1 to PBn 231 coupled to the bit lines BL1 to BLn. The page buffers PB1 to PBn 231 may be operated in response to page buffer control signals PBSIGNALS. For example, the page buffers PB1 to PBn 231 may temporarily store data received through the data lines DL and then control the voltage levels of the bit lines BL1 to BLn depending on the temporarily stored data during a program operation, or may sense the voltages or currents of the bit lines BL1 to BLn during a read operation or a verify operation. Further, the page buffers PB1 to PBn 231 may sense the voltages or currents of the bit lines BL1 to BLn during the operation of monitoring the threshold voltage distributions of the select transistors and the pipe transistor.

The column decoder 240 may transfer data between the input/output circuit 250 and the page buffer group 230 in response to a column address CADD. For example, the column decoder 240 may exchange data with the page buffers 231 through data lines DL or may exchange data with the input/output circuit 250 through column lines CL.

The input/output circuit 250 may transmit an internal command CMD and an address ADD, received from the memory controller (e.g., 1200 of FIG. 1), to the control logic 300, or may exchange data with the column decoder 240.

The pass/fail check circuit 260 may generate a reference current in response to an enable bit VRY_BIT<#> and may output a pass signal PASS or a fail signal FAIL by comparing a sensing voltage VPB, received from the page buffer group 230, with a reference voltage, generated based on the reference current, during the read operation or the verify operation.

The source line driver 270 may be coupled to memory cells included in the memory cell array 100 through a source line SL, and may control the voltage of a source node. In an example, the source line driver 270 may electrically couple the source node of each memory cell to a ground node during a read or verify operation. Further, the source line driver 270 may apply a ground voltage to the source node of each memory cell during a program operation. The source line driver 270 may apply an erase voltage to the source node of each memory cell during an erase operation. The source line driver 270 may receive a source line control signal CTRL_SL from the control logic 300, and may control the voltage of the source node in response to the source line control signal CTRL_SL.

The control logic 300 may control the peripheral circuits 200 by outputting the operation signal OP_CMD, the row address RADD, the page buffer control signals PBSIGNALS, and the enable bit VRY_BIT<#> in response to the internal command CMD and the address ADD. In addition, the control logic 300 may determine whether a verify operation has passed or failed in response to the pass or fail signal PASS or FAIL.

Further, when the threshold voltage distributions of the select transistors and the pipe transistor are found to fall out of a normal range as a result of the operation of monitoring the threshold voltage distributions of the select transistors and the pipe transistor, the control logic 300 may control the peripheral circuits 200 so that, after the select transistors and the pipe transistor are erased, they are reprogrammed. Also, the control logic 300 may control the peripheral circuits 200 so that, after the select transistors and the pipe transistor are reprogrammed (or programed again), the threshold voltage distributions thereof are re-monitored (or monitored again).

Figure 3:
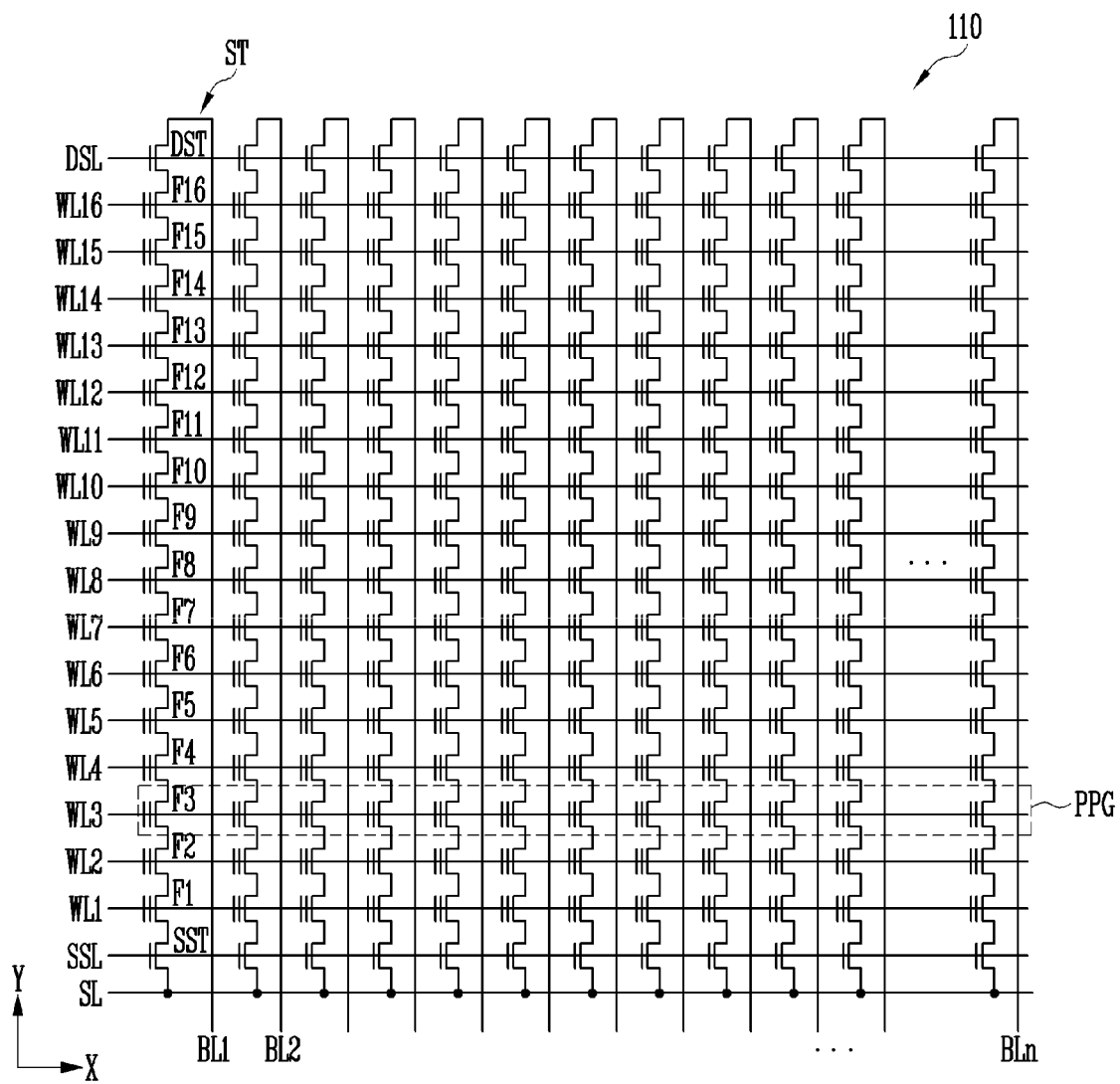
FIG. 3 is a diagram illustrating a memory block of FIG. 2.

FIG. 3 is a diagram illustrating the memory block of FIG. 2.

Referring to FIG. 3, the memory block 110 may be configured such that a plurality of word lines, which are arranged in parallel, are coupled between a first select line and a second select line. Here, the first select line may be a source select line SSL and the second select line may be a drain select line DSL. For example, the memory block 110 may include a plurality of strings ST coupled between bit lines BL1 to BLn and a source line SL. The bit lines BL1 to BLn may be respectively coupled to the strings ST, and the source line may be coupled in common to the strings ST. Since the strings ST may have the same configuration, a string ST coupled to the first bit line BL1 will be described by way of example.

The string ST may include a source select transistor SST, a plurality of memory cells F1 to F16, and a drain select transistor DST, which are connected in series between the source line SL and the first bit line BL1. One string ST may include one or more source select transistors SST and drain select transistors DST, and may include more memory cells than the memory cells F1 to F16 illustrated in the drawing.

A source of the source select transistor SST may be coupled to the source line SL and a drain of the drain select transistor DST may be coupled to the first bit line BL1. The memory cells F1 to F16 may be connected in series between the source select transistor SST and the drain select transistor DST. Gates of the source select transistors SST included in different strings ST may be coupled to a source select line SSL, gates of the drain select transistors DST may be coupled to a drain select line DSL, and gates of the memory cells F1 to F16 may be coupled to a plurality of word lines WL1 to WL16. A group of memory cells coupled to the same word line, among the memory cells included in different strings ST, may be referred to as a "physical page PPG." Therefore, a number of physical pages PPG that are identical to the number of word lines WL1 to WL16 may be included in the memory block 110.

One memory cell may store one bit of data. This is typically referred to as a "single-level cell (SLC)." In this case, one physical page PPG may store data corresponding to one logical page LPG. The data corresponding to one logical page LPG may include a number of data bits identical to the number of cells included in one physical page PPG. Further, one memory cell may store two or more bits of data. This cell is typically referred to as a "multi-level cell (MLC)". Here, one physical page PPG may store data corresponding to two or more logical pages LPG.

The above-described source select transistor SST and drain select transistor DST may be programmed to have uniform threshold voltages, and may be turned on or off by operating voltages that are applied through the source select line SSL and the drain select line DSL during the overall operations, such as a program operation, a read operation, and an erase operation. Due to this, when the threshold voltages of the source select transistor SST and the drain select transistor DST decrease or increase non-uniformly, errors may occur in turn-on or turn-off operations.

Figure 4:
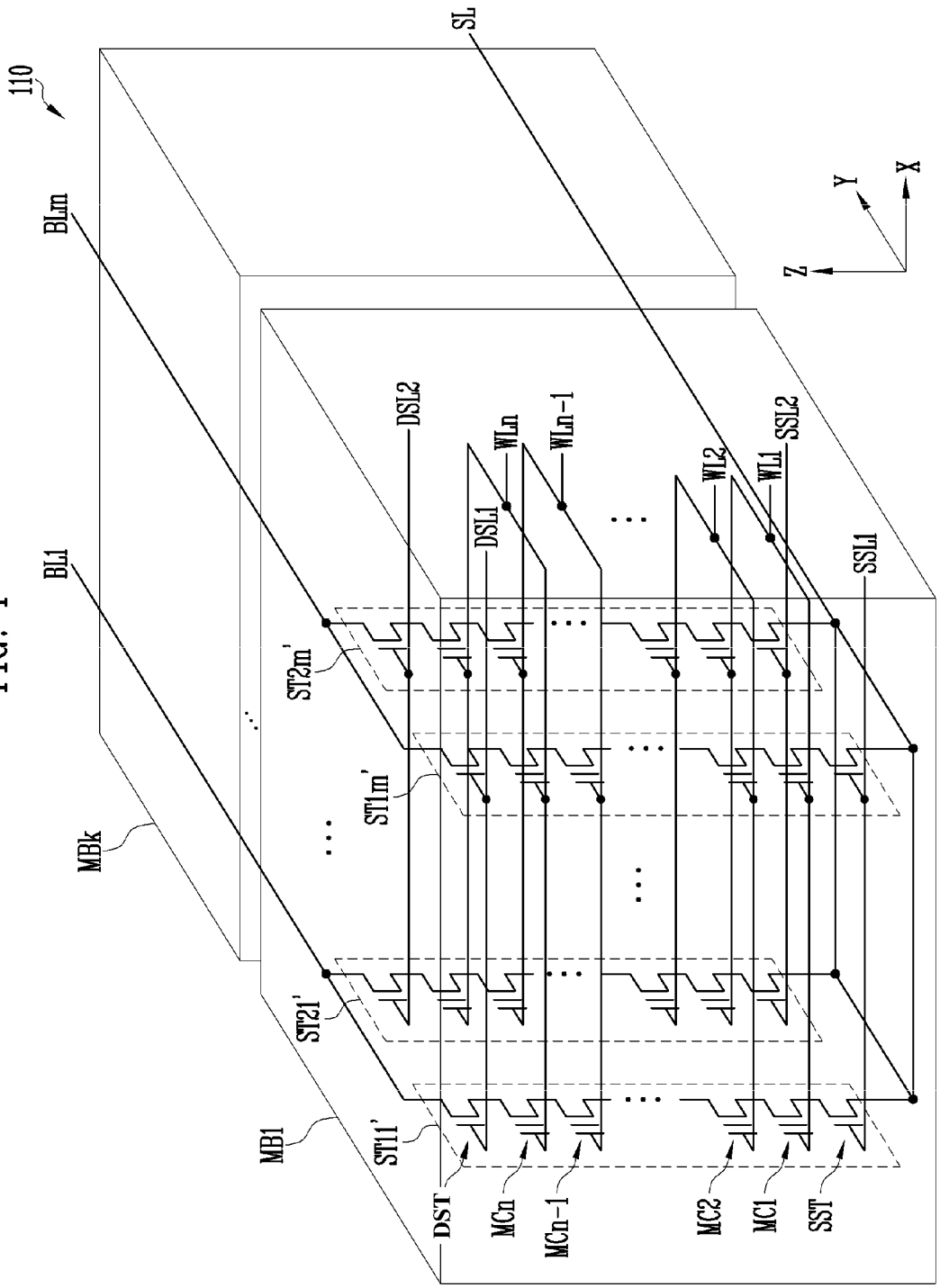
FIG. 4 is a diagram illustrating an example of a memory block having a 3D structure.

FIG. 4 is a diagram illustrating an example of a memory block having a three-dimensional (3D) structure.

Referring to FIG. 4, a memory cell array 100 may include a plurality of memory blocks MB1 to MBk 110. Each of the memory blocks 110 may include a plurality of strings ST11' to ST1m' and ST21' to ST2m'. Each of the strings ST11' to ST1m' and ST21' to ST2m' may extend in a vertical direction (e.g., Z direction). In the memory block 110, m strings may be arranged in a row direction (e.g., X direction). Although, in FIG. 4, two strings are illustrated as being arranged in a column direction (e.g., Y direction), this embodiment is given for convenience of description, and three or more strings may be arranged in the column direction (e.g., Y direction) in other embodiments.

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between a source line SL and the memory cells MC1 to MCn. The source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to one source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Thereby, the reliability of data stored in the memory block 110 may be improved.

The drain select transistor DST of each string may be coupled between the corresponding bit line and the memory cells MC1 to MCn. The drain select transistors DST of strings arranged in the row direction may be coupled to a drain select line extending in the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

Figure 5:
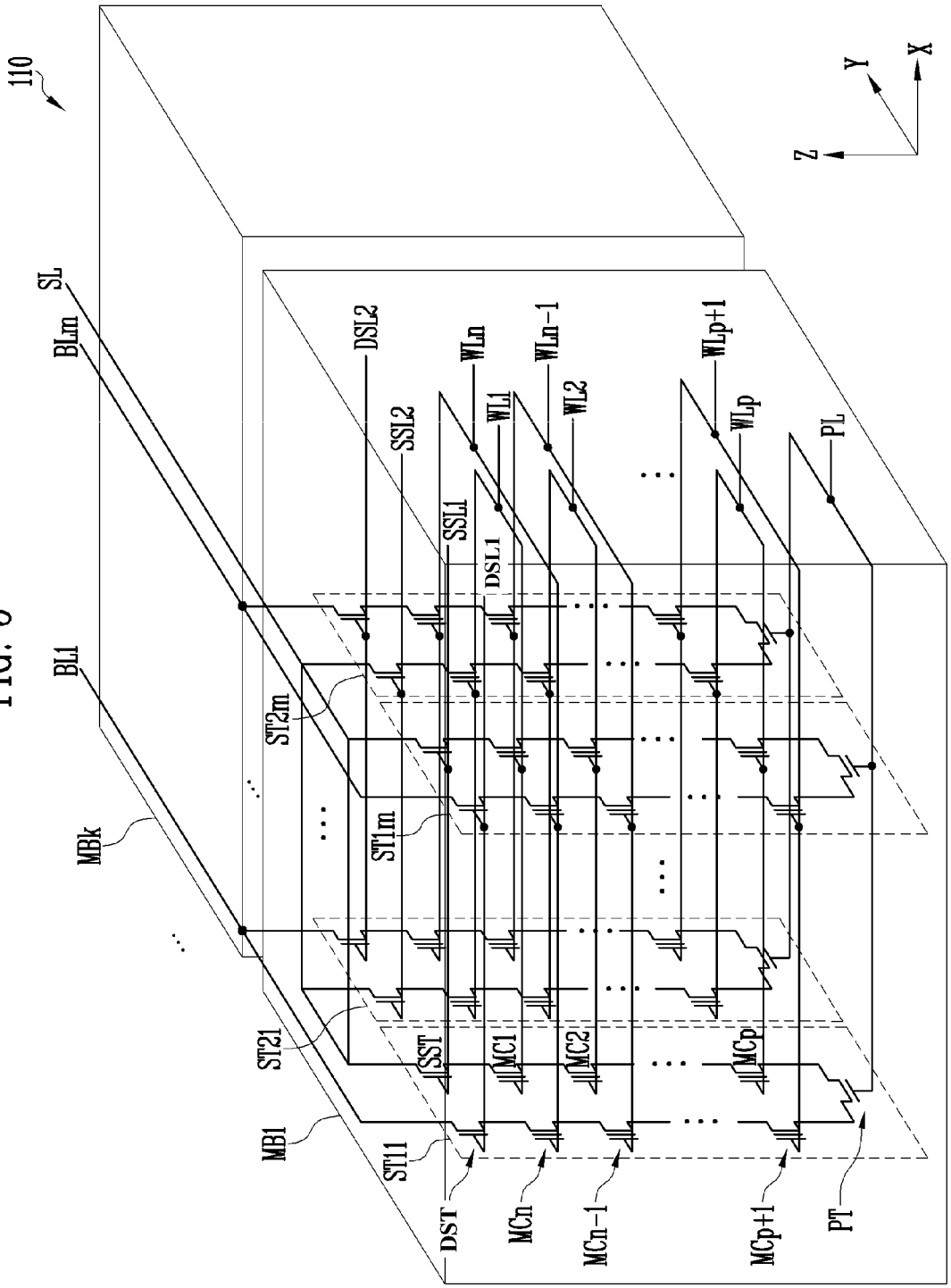
FIG. 5 is a diagram illustrating an example of a memory block having a 3D structure.

FIG. 5 is a diagram illustrating an example of a memory block having a 3D structure.

Referring to FIG. 5, a memory cell array 100 may include a plurality of memory blocks MB1 to MBk 110. Each of the memory blocks 110 may include a plurality of strings ST11 to ST1m and ST21 to ST2m. In an embodiment, each of the strings ST11 to ST1m and ST21 to ST2m may be formed in a 'U' shape. In the first memory block MB1, m strings may be arranged in a row direction (e.g., X direction). Although, in FIG. 5, two strings are illustrated as being arranged in a column direction (e.g., Y direction), this embodiment is given for convenience of description, and three or more strings may be arranged in the column direction (e.g., Y direction) in other embodiments.

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have a similar structure. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. For example, a pillar for providing at least one of the channel layer, the tunnel insulating layer, the charge trap layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 5, the source select transistors of the strings ST11 to ST1m in a first row may be coupled to a first source select line SSL1. The source select transistors of the strings ST21 to ST2m in a second row may be coupled to a second source select line SSL2.

In other embodiments, the source select transistors of the strings ST11 to ST1m and ST21 to ST2m may be coupled in common to one source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a vertical direction (e.g., Z direction), and may be coupled in series between the source select transistor SST and the pipe transistor PT. The p+1-th to n-th memory cells MCp+1 to MCn may be sequentially arranged in the vertical direction (e.g., Z direction), and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1$m$ in the first row may be coupled to a drain select line DSL1. The drain select transistors of the strings ST21 to ST2$m$ in the second row may be coupled to a second drain select line DSL2.

The strings arranged in the column direction may be coupled to bit lines extending in the column direction. In FIG. 5, the strings ST11 and ST21 in a first column may be coupled to a first bit line BL1. The strings ST1$m$ and ST2$m$ in an m-th column may be coupled to an m-th bit line BLm.

Among strings arranged in the row direction, memory cells coupled to the same word line may constitute one page. For example, memory cells coupled to the first word line WL1, among the strings ST11 to ST1$m$ in the first row, may constitute one page. Among the strings ST21 to ST2$m$ in the second row, memory cells coupled to the first word line WL1 may constitute one additional page. Strings arranged in the direction of a single row may be selected by selecting any one of the drain select lines DSL1 and DSL2. One page may be selected from the selected strings by selecting any one of the word lines WL1 to WLn.

That is, the memory block 110 of FIG. 5 may have an equivalent circuit similar to that of the memory block 110 of FIG. 4 except that a pipe transistor PT is included in each string.

The at least one source select transistor SST, the pipe transistor PT, and the at least one drain select transistor DST in FIGS. 4 and 5 may be programmed to have uniform threshold voltages, and may be turned on or off by the operating voltages that are applied through a source select line SSL and a drain select line DSL during the overall operations, such as a program operation, a read operation, and an erase operation. Due to this, when the threshold voltages of the at least one source select transistor SST, the pipe transistor PT, and the at least one drain select transistor DST decrease or increase non-uniformly, errors may occur in turn-on or turn-off operations.

Figure 6:
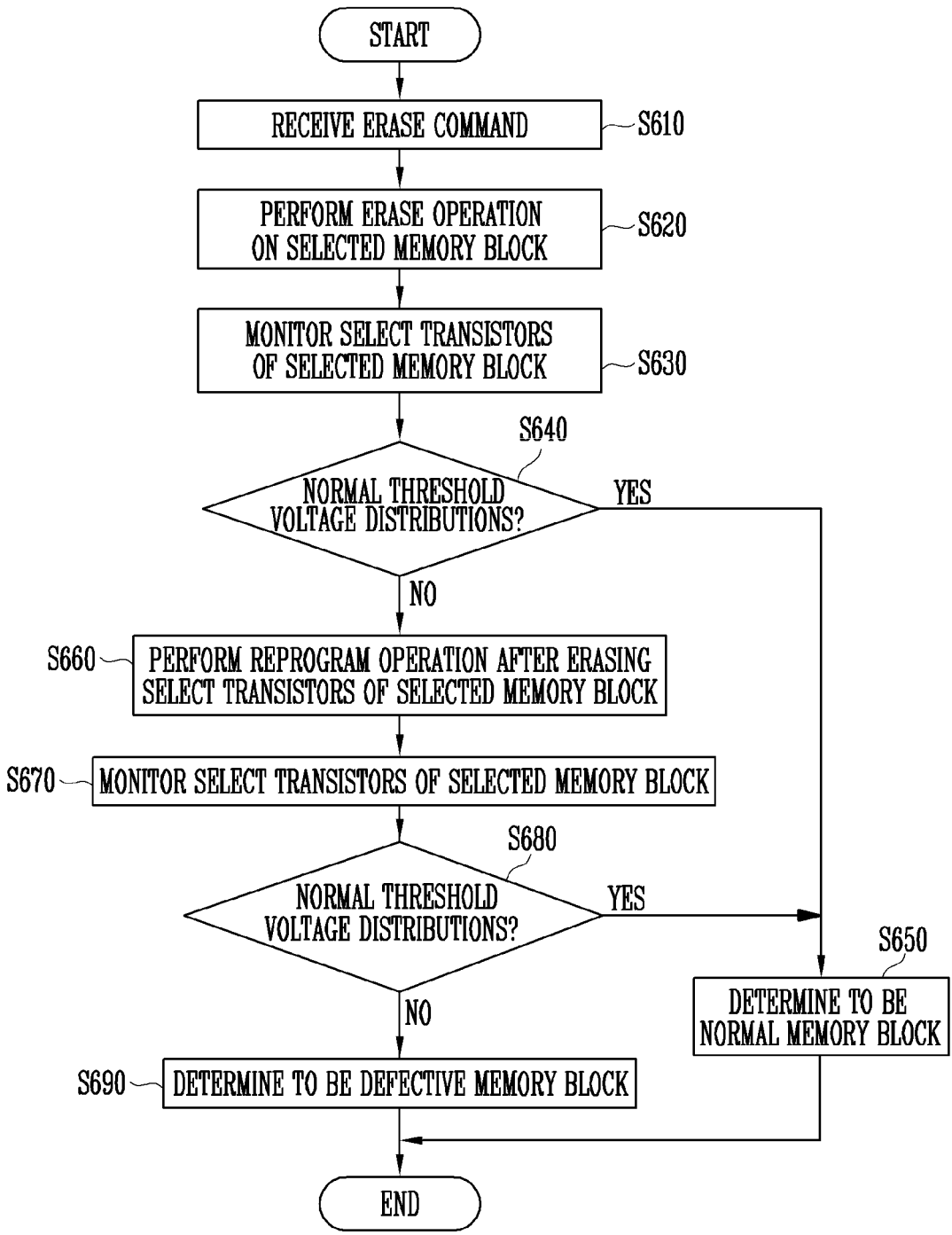
FIG. 6 is a flowchart illustrating a method of operating a memory system according to an embodiment of the present disclosure.

FIG. 6 is a flowchart illustrating a method of operating a memory system according to an embodiment of the present disclosure.

Figure 7:
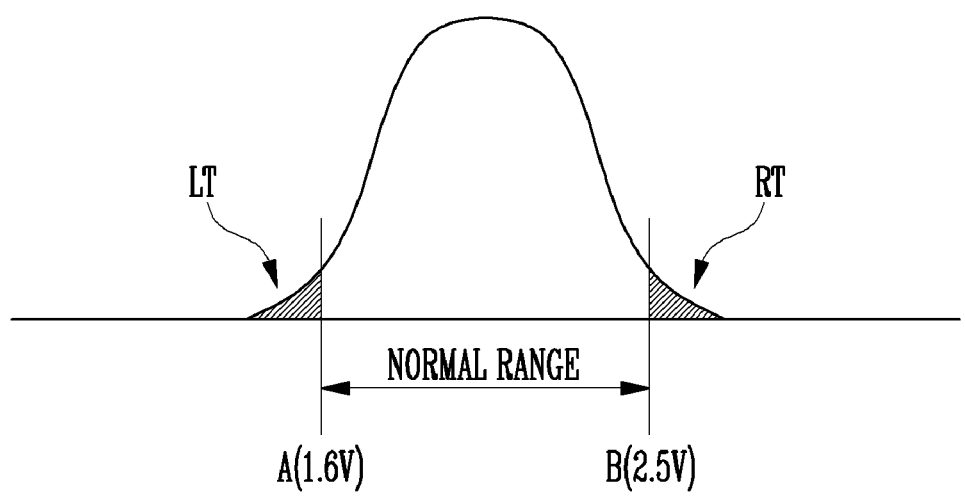
FIG. 7 is a diagram illustrating threshold voltage distributions of select transistors according to an embodiment of the present disclosure.

FIG. 7 is a diagram illustrating threshold voltage distributions of select transistors according to an embodiment of the present disclosure.

The method of operating the memory system according to the embodiment of the present disclosure will be described with reference to FIGS. 1 to 7.

When an erase command and an address for requesting an erase operation are received from a host 2000 at step S610, a memory controller 1200 may generate an internal command CMD corresponding to the erase command, and may output the internal command CMD and the address ADD to a memory device 1100.

The memory device 1100 may select at least one memory block (e.g., MB1) from among a plurality of memory blocks MB1 to MBk 110 in response to the address ADD. Further, the memory device 1100 may perform an erase operation on the selected memory block (e.g., MB1) in response to the internal command CMD at step S620. A source select transistor SST, a drain select transistor DST, and a pipe transistor PT included in the selected memory block (e.g., MB1) may be in a programmed state so that they have uniform threshold voltages.

The erase operation will be described in brief below.

The control logic 300 may generate a source line control signal CTRL_SL in response to the internal command CMD, and the source line driver 270 may supply an erase voltage to a source line SL based on the source line control signal CTRL_SL. A row decoder 220 may apply a select line voltage (e.g., ground voltage) to source select lines SSL1 and SSL2 and drain select lines DSL1 and DSL2, among the local lines LL of the selected memory block (e.g., MB1), and may control a plurality of word lines WL1 to WLn to float. Here, a pass voltage may be applied to a pipeline PL, so that the pipe transistor PT may be turned on. A Gate Induced Drain Leakage (GIDL) current may be generated in a lower channel of the source select transistor SST due to the erase voltage applied to the source line SL, and hot holes caused by the GIDL current are supplied to the channel layer of a plurality of strings ST11 to ST1$m$ and ST21 to ST2$m$. Thereafter, when the row decoder 220 discharges a plurality of word lines WL1 to WLn of the selected memory block (e.g., MB1) to a ground voltage level, a voltage differences between the word lines WL1 to WLn and the channels of the strings ST11 to ST1$m$ and ST21 to ST2$m$ increase to a sufficiently high level. Accordingly, electrons trapped in the charge storage layers of the memory cells MC1 to MCn included in the selected memory block MB1 are emitted to the channels, so that the threshold voltages of the memory cells decrease, with the result that the memory cells are erased.

The above-described erase operation corresponds to an example of various erase methods for a flash memory device, and thus the embodiment of the present disclosure is not limited thereto and various erase methods for the flash memory device may be applied to the present disclosure.

During the above-described erase operation, the source select transistor SST, the pipe transistor PT, and the drain select transistor DST are not erased, and may maintain uniform threshold voltages.

After the above-described erase operation, the memory device 1100 monitors (i.e., through a threshold voltage distribution scan operation) the threshold voltage distributions of the source select transistor SST, the pipe transistor PT, and the drain select transistor DST included in the selected memory block (e.g., MB1) at step S630.

This procedure of a threshold voltage distribution scan operation will be described below. That is, the memory device 1100 may scan the threshold voltage distributions of the source select transistor SST, the pipe transistor PT, and the drain select transistor DST included in the selected memory block (e.g., MB1), and may detect whether the threshold voltage distributions fall within a normal range from A to B, or are present in a left tail (LT) area or a right tail (RT) area which falls out of the normal range from A to B, as illustrated in FIG. 7.

A scheme for scanning threshold voltage distributions will be described below.

The page buffer group 230 may precharge bit lines BL1 to BLn to a preset level. The voltage generation circuit 210 may generate and output a first detection voltage A (e.g., 1.6 V), and the row decoder 220 may apply the first detection voltage A to a line (e.g., source select line, drain select line, or pipeline) coupled to the transistor (e.g., source select transistor, drain select transistor or pipe transistor) of the selected memory block MB1. Thereafter, the page buffer group 230 may sense the potential levels of the bit lines BL1 to BLn, and may then detect whether there is a transistor (e.g., source select transistor, drain select transistor, or pipe transistor) having a threshold voltage lower than the first detection voltage A.

Further, the page buffer group 230 may precharge the bit lines BL1 to BLn to a preset level. The voltage generation circuit 210 may generate and output a second detection voltage B (e.g., 2.5 V), and the row decoder 220 may apply the second detection voltage B to the line (e.g., source select line, drain select line, or pipeline) coupled to the transistor (e.g., source select transistor, drain select transistor or pipe transistor) of the selected memory block MB1. Thereafter, the page buffer group 230 may sense the potential levels of the bit lines BL1 to BLn, and may then detect whether there is a transistor (e.g., source select transistor, drain select transistor, or pipe transistor) having a threshold voltage higher than the second detection voltage B.

By means of the above-described scheme, it may be detected and monitored whether the threshold voltage distributions of the source select transistor SST, the drain select transistor DST, and the pipe transistor PT are within the normal range from A to B, or are present in the left tail (LT) area or the right tail (RT) area which is not within or is outside the normal range from A to B (i.e., greater than or less than the normal range from A to B).

Based on the result of the monitoring (i.e., through performing the threshold voltage distribution scan operation), the control logic 300 may determine whether the source select transistor SST, the drain select transistor DST, and the pipe transistor PT of the selected memory block have normal threshold voltage distributions at step S640.

When, as a result of the determination, the threshold voltage distributions of the source select transistor SST, the pipe transistor PT, and the drain select transistor DST fall within the normal range from A to B (in case of "Yes"), the control logic 300 may determine the selected memory block MB1 to be a normal memory block, and may output the result of the determination to the defective memory block management unit 1210 at step S650. The memory block MB1 determined to be a normal memory block may be selected in the next overall operation of the memory device 1100, and may be subjected to a program operation.

When, as a result of the determination, the threshold voltage distributions of the source select transistor SST, the pipe transistor PT, and the drain select transistor DST are present in the area LT or RT which falls out of the normal range from A to B (in case of "No"), the control logic 300 may control the peripheral circuits 200 so that the source select transistor SST, the pipe transistor PT, and the drain select transistor DST of the selected memory block MB1 are erased and are thereafter reprogrammed (or programed again) to have uniform threshold voltages at step S660.

Thereafter, the threshold voltage distributions of the source select transistor SST, the pipe transistor PT, and the drain select transistor DST included in the selected memory block (e.g., MB1) are monitored at step S670. A monitoring method is similar to that of step S630, and thus a repetitive description thereof will be omitted.

Based on the result of the monitoring (i.e., through performing the threshold voltage distribution scan operation), the control logic 300 may determine whether the reprogrammed source select transistor SST, drain select transistor DST, and pipe transistor PT of the selected memory block have normal threshold voltage distributions at step S680.

When, as a result of the determination, the threshold voltage distributions of the source select transistor SST, the pipe transistor PT, and the drain select transistor DST fall within the normal range from A to B (in case of "Yes"), the control logic 300 may determine the selected memory block MB1 to be a normal memory block, and may output the result of the determination to the defective memory block management unit 1210 at step S650.

When it is determined that the threshold voltage distributions of the source select transistor SST, the pipe transistor PT, and the drain select transistor DST are present in the area LT or RT which falls out of the normal range from A to B (in case of "No"), the control logic 300 may determine the selected memory block MB1 to be a defective memory block, and may output the result of the determination to the defective memory block management unit 1210 at step S690. The memory block MB1 determined to be the defective memory block may be excluded from selection of memory blocks in the next overall operation of the memory device 1100.

As described above, in accordance with the embodiments of the present disclosure, after the erase operation of a selected memory block, threshold voltage distributions of select transistors and a pipe transistor included in the selected memory block may be monitored, select transistors and a pipe transistor falling out of a normal range may be detected, and the selected memory block may be classified and managed as a normal memory block or a defective memory block based on the result of the detection.

Figure 8:
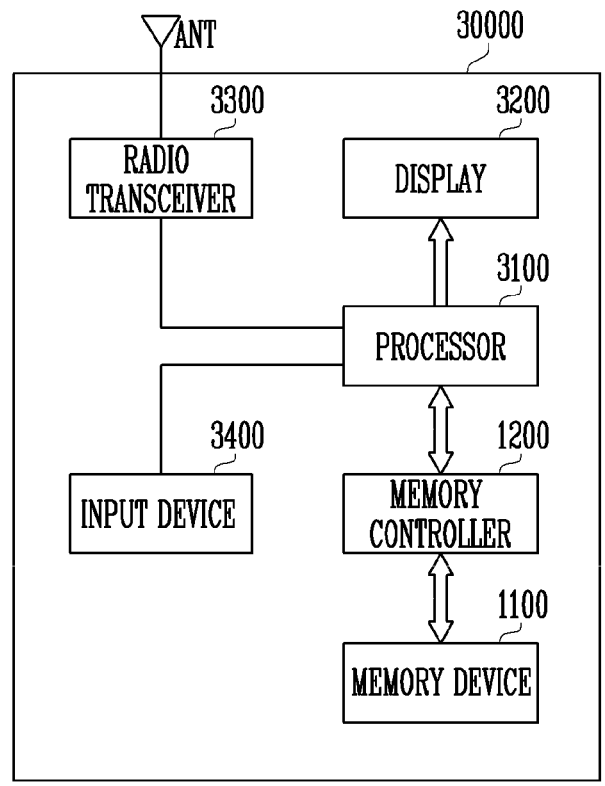
FIG. 8 is a diagram illustrating an embodiment of a memory system.

FIG. 8 is a diagram illustrating an embodiment of a memory system.

Referring to FIG. 8, a memory system 30000 may be embodied in a cellular phone, a smartphone, a tablet PC, a personal digital assistant (PDA) or a wireless communication device. The memory system 30000 may include the memory device 1100 and a memory controller 1200 capable of controlling the operation of the memory device 1100. The memory controller 1200 may control a data access operation, e.g., a program, erase, or read operation, of the memory device 1100 under the control of a processor 3100.

Data programmed in the memory device 1100 may be outputted through a display 3200 under the control of the memory controller 1200.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal outputted from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal outputted from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard, etc. The processor 3100 may control the operation of the display 3200 such that data outputted from the memory controller 1200, data from the radio transceiver 3300 or data from the input device 3400 is outputted through the display 3200.

In an embodiment, the memory controller 1200 capable of controlling the operation of the memory device 1100 may be implemented as a part of the processor 3100 or a chip provided separately from the processor 3100. Further, the memory controller 1200 may be implemented through the example of the memory controller illustrated in FIG. 1, and the memory device 1100 may be implemented through the example of the memory device illustrated in FIG. 2.

Figure 9:
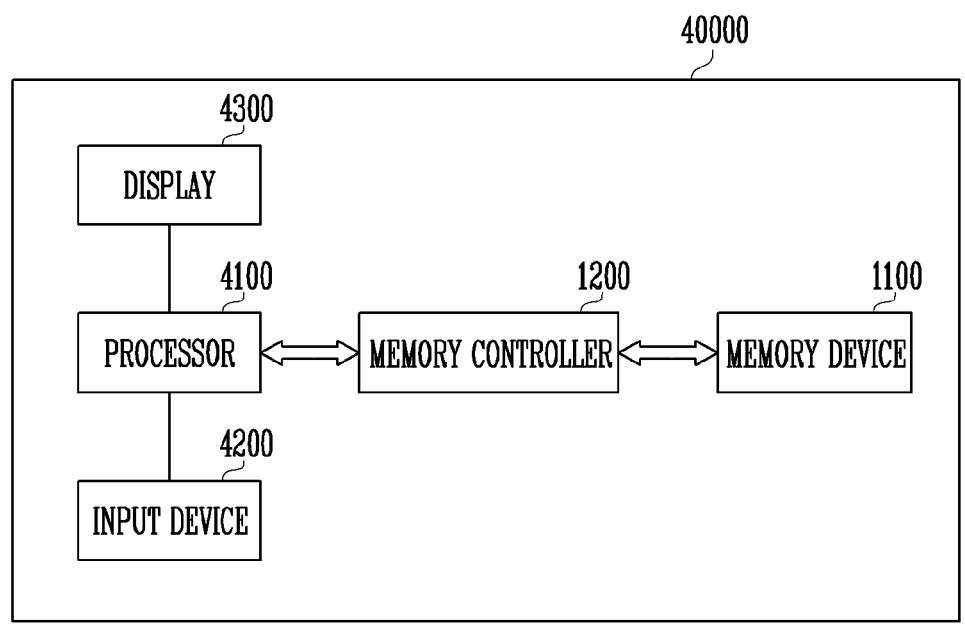
FIG. 9 is a diagram illustrating an embodiment of a memory system.

FIG. 9 is a diagram illustrating an embodiment of a memory system.

Referring to FIG. 9, a memory system 40000 may be embodied in a personal computer, a tablet PC, a net-book, an e-reader, a personal digital assistant (PDA), a portable multimedia player (PMP), an MP3 player, or an MP4 player, etc.

The memory system 40000 may include the memory device 1100 and a memory controller 1200 capable of controlling the data processing operation of the memory device 1100.

A processor 4100 may output data stored in the memory device 1100 through a display 4300, according to data inputted from an input device 4200. For example, the input device 4200 may be implemented as a point device such as a touch pad or a computer mouse, a keypad or a keyboard, etc.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100. Further, the memory controller 1200 may be implemented through the example of the memory controller illustrated in FIG. 1, and the memory device 1100 may be implemented through the example of the memory device illustrated in FIG. 2.

Figure 10:
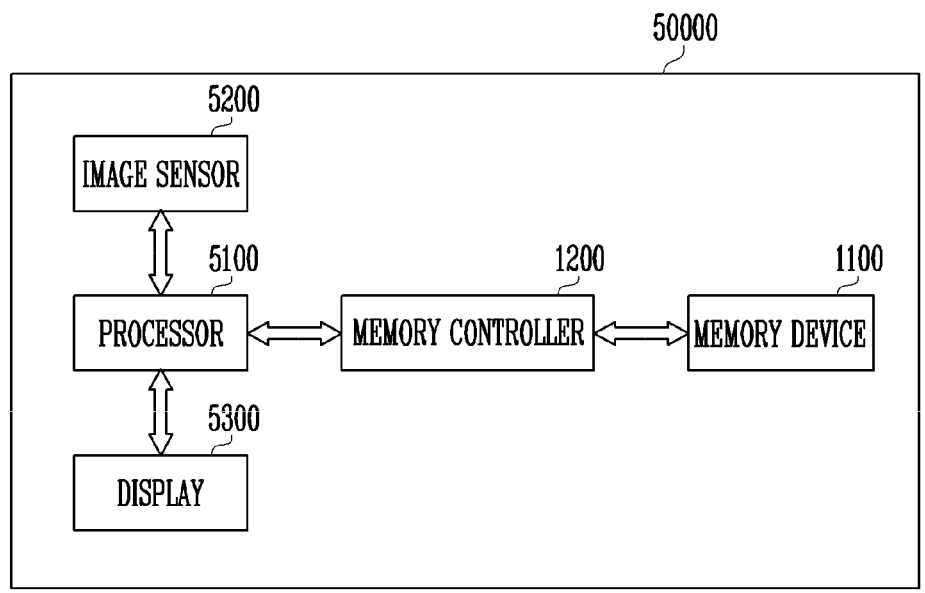
FIG. 10 is a diagram illustrating an embodiment of a memory system.

FIG. 10 is a diagram illustrating an embodiment of a memory system.

Referring to FIG. 10, a memory system 50000 may be embodied in an image processing device, e.g., a digital camera, a portable phone provided with a digital camera, a smartphone provided with a digital camera, or a tablet PC provided with a digital camera, etc.

The memory system 50000 may include the memory device 1100 and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be outputted through a display 5300 or stored in the memory device 1100 through the memory controller 1200. Data stored in the memory device 1100 may be outputted through the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100. Further, the memory controller 1200 may be implemented through the example of the memory controller illustrated in FIG. 1, and the memory device 1100 may be implemented through the example of the memory device illustrated in FIG. 2.

Figure 11:
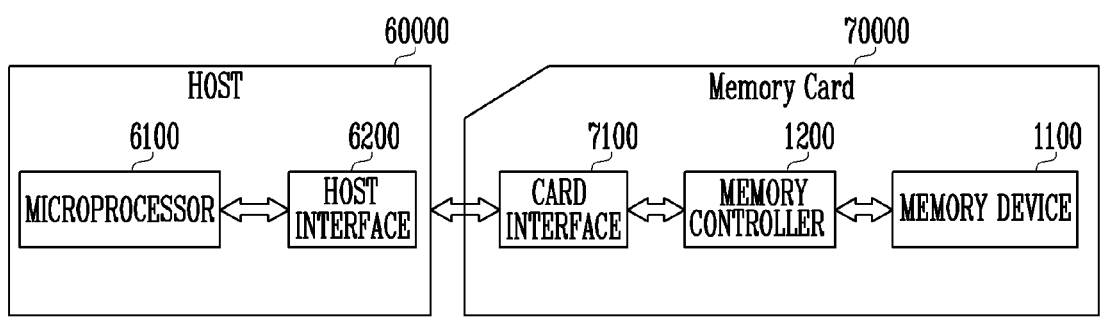
FIG. 11 is a diagram illustrating an embodiment of a memory system.

FIG. 11 is a diagram illustrating an embodiment of a memory system.

Referring to FIG. 11, a memory system 70000 may be embodied in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol, etc. Here, the card interface may refer to hardware capable of supporting a protocol which is used by the host 60000, software installed in the hardware, or a signal transmission method.

When the memory system 70000 is coupled to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100. Further, the memory controller 1200 may be implemented through the example of the memory controller illustrated in FIG. 1, and the memory device 1100 may be implemented through the example of the memory device illustrated in FIG. 2.

While the examples of the embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not always be performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

In accordance with the present disclosure, a defective memory block may be determined by monitoring threshold voltage distributions of select transistors included in a memory device, thus preventing errors from occurring due to the defective memory block.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic concepts described herein will still fall within the spirit and scope of the present disclosure as defined in the appended claims and their equivalents.

What is claimed is:

1. A memory device, comprising:
   one or more memory blocks;
   one or more peripheral circuits configured to perform an erase operation and a threshold voltage distribution scan operation on a selected memory block; and
   a control logic configured to control the one or more peripheral circuits, and determine the selected memory block to be a normal memory block or a defective memory block based on a result of the threshold voltage distribution scan operation,
   wherein the control logic is configured to control the one or more peripheral circuits to perform the threshold voltage distribution scan operation after the erase operation on the selected memory block is completed, and
   wherein the one or more peripheral circuits are configured to scan threshold voltage distributions of select transistors included in the selected memory block during the threshold voltage distribution scan operation, and detect whether scanned threshold voltage distributions fall within a normal range, or a left tail area or a right tail area falling out of the normal range.

2. The memory device according to claim 1, wherein the control logic is configured to, when it is detected that the threshold voltage distributions of the one or more select transistors are not within the normal range as a result of the threshold voltage distribution scan operation, control the one or more peripheral circuits so that the one or more select transistors in the selected memory block are erased and are thereafter reprogrammed.

3. The memory device according to claim 2, wherein the control logic is configured to control the one or more peripheral circuits so that, after the one or more select transistors are reprogrammed, the threshold voltage distribution scan operation is performed again.

4. The memory device according to claim 3, wherein the control logic is configured to determine the selected memory block to be the defective memory block or the normal memory block based on a result of performing the threshold voltage distribution scan operation again.

5. The memory device according to claim 1, wherein the one or more select transistors comprise a source select transistor and a drain select transistor.

6. The memory device according to claim 5, wherein the one or more select transistors further comprise a pipe transistor.

7. A memory device, comprising:
   one or more memory blocks;
   one or more peripheral circuits configured to perform an erase operation on a selected memory block and a threshold voltage distribution scan operation on one or more select transistors included in the selected memory block; and
   a control logic configured to control the one or more peripheral circuits and determine the selected memory block to be a normal memory block or a defective memory block based on a result of the threshold voltage distribution scan operation,
   wherein the control logic is configured to control the one or more peripheral circuits to perform the threshold voltage distribution scan operation after the erase operation of the selected memory block is completed, and
   wherein the one or more peripheral circuits are configured to scan threshold voltage distributions of the select transistors included in the selected memory block during the threshold voltage distribution scan operation, and detect whether scanned threshold voltage distributions fall within a normal range, or a left tail area or a right tail area falling out of the normal range.

8. The memory device according to claim 7, wherein the control logic is configured to, when it is detected that the threshold voltage distributions of the one or more select transistors are not within the normal range as a result of the threshold voltage distribution scan operation, control the one or more peripheral circuits so that the one or more select transistors of the selected memory block are erased and are thereafter reprogrammed.

9. The memory device according to claim 8, wherein the control logic is configured to control the one or more peripheral circuits so that, after the one or more select transistors are reprogrammed, the threshold voltage distribution scan operation is performed again.

10. The memory device according to claim 9, wherein the control logic is configured to determine the selected memory block to be the defective memory block or the normal memory block based on a result of performing the threshold voltage distribution scan operation again.

11. The memory device according to claim 7, wherein the one or more select transistors comprise a source select transistor and a drain select transistor.

12. The memory device according to claim 11, wherein the one or more select transistors further comprise a pipe transistor.

13. A method of operating a memory device, comprising:
    performing an erase operation on a selected memory block;
    scanning threshold voltage distributions of one or more select transistors included in the selected memory block after the erase operation on the selected memory block is completed; and
    detecting whether scanned threshold voltage distributions of the select transistors of the selected memory block fall within a normal range, or a left tail area or a right tail area falling out of the normal range.

14. The method according to claim 13, wherein, when it is determined that the scanned threshold voltage distributions of the one or more select transistors are within the normal range, the selected memory block is determined to be the normal memory block.

15. The method according to claim 13, further comprising:
    when it is determined that the scanned threshold voltage distributions of the select transistors are not within the normal range, erasing the one or more select transistors included in the selected memory block, and thereafter reprogramming the one or more select transistors; and
    scanning threshold voltage distributions of the reprogrammed one or more select transistors again; and determining whether the again scanned threshold voltage distributions of the one or more select transistors fall within the normal range or are not within the normal range.

16. The method according to claim 15, wherein, when it is determined that the scanned threshold voltage distributions of the one or more select transistors are greater than or less than the normal range, the selected memory block is determined to be the defective memory block.

17. The method according to claim 13, wherein the one or more select transistors comprise a source select transistor, a drain select transistor, and a pipe transistor.

\* \* \* \* \*